US005696834A

United States Patent [19]

Kitagawa

[11] Patent Number: 5,696,834

[45] Date of Patent: Dec. 9, 1997

[54] STEREO SYSTEM AND STEREO METHOD FOR ELECTRONIC ACOUSTICAL SYSTEM

[75] Inventor: Hiroshi Kitagawa, Iwata, Japan

[73] Assignee: Kawai Musical Inst. Mfg. Co., Ltd., Shizuoka, Japan

[21] Appl. No.: 965,706

[22] Filed: Oct. 23, 1992

[30] Foreign Application Priority Data

Oct. 25, 1991 [JP] Japan .................................... 3-279294

[51] Int. Cl.$^{6}$ .......................................................... H03G 3/00

[52] U.S. Cl. .................................................. 381/61; 381/17

[58] Field of Search .................................. 381/61, 62, 63, 381/104–109, 17; 84/DIG. 27, DIG. 26, 630, 707

[56] References Cited

U.S. PATENT DOCUMENTS

| | | | |
|---|---|---|---|
| 4,188,504 | 2/1980 | Kasuga et al. | 381/17 |
| 4,628,789 | 12/1986 | Fujimori | 381/63 |
| 5,027,689 | 7/1991 | Fujimori | 84/DIG. 27 |
| 5,073,942 | 12/1991 | Yoshida et al. | 381/61 |
| 5,119,420 | 6/1992 | Kato et al. | 381/63 |
| 5,127,306 | 7/1992 | Mitsuhashi et al. | 84/665 |
| 5,198,604 | 3/1993 | Higashi et al. | 84/626 |
| 5,272,274 | 12/1993 | Kimura | 381/63 |
| 5,474,082 | 12/1995 | Junker | 340/825.19 |

OTHER PUBLICATIONS

"Achiz Cookbook Filter," Dan Lancaster, Aug. 15, 1980.

*Primary Examiner*—Curtis Kuntz
*Assistant Examiner*—Ping W. Lee

[57] ABSTRACT

According to the invention, sound data is distributed as a plurality of sound data, and the distributed sound data are combined to obtain a plurality of synthesized sound data. The synthesized sound data are sounded by a plurality of speakers, thus forming a sound image. Through combining and multiplexing of sound data in this way, stereo sounds having a sense of spatiality are generated.

33 Claims, 6 Drawing Sheets

FIG. 4

| DIRECTION | LEFT | | | | CENTER | | | | RIGHT |
|---|---|---|---|---|---|---|---|---|---|
| OUTPUT LINES | A3,B3 | | A2,B2 | | | | A1,B1 | | A0,B0 |
| SOUND IMAGE POSITION / DATA SIP | 1 | 7/8 | 6/8 | 5/8 | 4/8 | 3/8 | 2/8 | 1/8 | 0 |
| A0,B0-0 0 0 0 | | | | | | | | | ○ |
| A0,B1-0 0 0 1 | | | | | | | | ○ | |
| A0,B2-0 0 1 0 | | | | | | ○ | | | |
| A0,B3-0 0 1 1 | | | | | ○ | | | | |
| A1,B0-0 1 0 0 | | | | | | | | ○ | |
| A1,B1-0 1 0 1 | | | | | | | ○ | | |
| A1,B2-0 1 1 0 | | | | | ○ | | | | |
| A1,B3-0 1 1 1 | | | | ○ | | | | | |
| A2,B0-1 0 0 0 | | | | | | ○ | | | |
| A2,B1-1 0 0 1 | | | | | ○ | | | | |
| A2,B2-1 0 1 0 | | | ○ | | | | | | |
| A2,B3-1 0 1 1 | | ○ | | | | | | | |
| A3,B0-1 1 0 0 | | | | | ○ | | | | |
| A3,B1-1 1 0 1 | | | | ○ | | | | | |
| A3,B2-1 1 1 0 | | ○ | | | | | | | |
| A3,B3-1 1 1 1 | ○ | | | | | | | | |

STEREO SYSTEM AND STEREO METHOD FOR ELECTRONIC ACOUSTICAL SYSTEM

BACKGROUND OF THE INVENTION

1. Field of the Invention

This invention relates to a stereo system and a stereo method for an electronic acoustical (sound) system and, more particularly, to a stereo system and a stereo method for forming sound images having a sense of spatiality.

2. Description of the Related Art

As a system for artificially producing stereo sounds from monaural sounds, a pan-pot is well known in the field of electronic musical instruments. A monaural sound (acoustic) signal for a right and a left sound (acoustic) signals are produced, using a pan-pot and these two signals are passed through attenuaters to change their gain and are then reproduced through respective amplifiers and loudspeakers. In this way, a sound image is formed. The attenuator gain is changed by manually operating a lever or the like coupled to the attenuaters.

However, since a pan-pot produces stereo sound signals from a single sound signal, the produced sound lacks the sense of spatiality compared to the case of an actual performance. For example, in a piano performance, we can hear multiplexed sounds when a single sound is produced from the piano, the multiplexed sounds including sounds produced as a result of reflection inside the piano and those produced as a result of reflection by the walls and ceiling of the performance hall, as well as the direct sound from the piano. Such a sound having a sense of spatiality cannot be obtained by producing stereo signals from a single sound signal.

SUMMARY OF THE INVENTION

An object of the present invention is to provide a stereo system and a stereo method, which permit production of a sense of spatiality similar to the sound produced when an acoustic musical instrument is played.

To attain the above object of the invention, a plurality of distributed sound (acoustic) data are produced from a single sound signal, from these distributed sound data a plurality of synthesized sound data are produced, and these synthesized sound data are sounded by a plurality of sounding means, thus forming a sound image. In this way, sound data for producing stereo are synthesized, and these sound data are combined and multiplexed to produce stereo sound having a rich sense of spatiality.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is is a view showing sound image positions formed according to sound image position data SIP;

The present invention will become more fully understood from the detailed description given hereinbelow and the accompanying drawings which are given by way of illustration only, and thus are not limitative of the present invention, and wherein:

DETAILED DESCRIPTION OF THE PREFERRED EMBODIMENT

Summary of the Embodiment

A single musical tone waveform data MW is provided through demultiplexers 10*a* and 10*b* to respective output lines, i.e., one of output lines A0 to A3 and one of output lines B0 to B3, according to sound image position data SIP. These provided data are distributed to multipliers 11*aa*, 11*ab*, . . . , 11*bd* for level reduction, and the outputs of the multipliers are synthesized by adders 12*a* and 12*b* to form a sound image.

1. Overall Circuit

Figure 1:
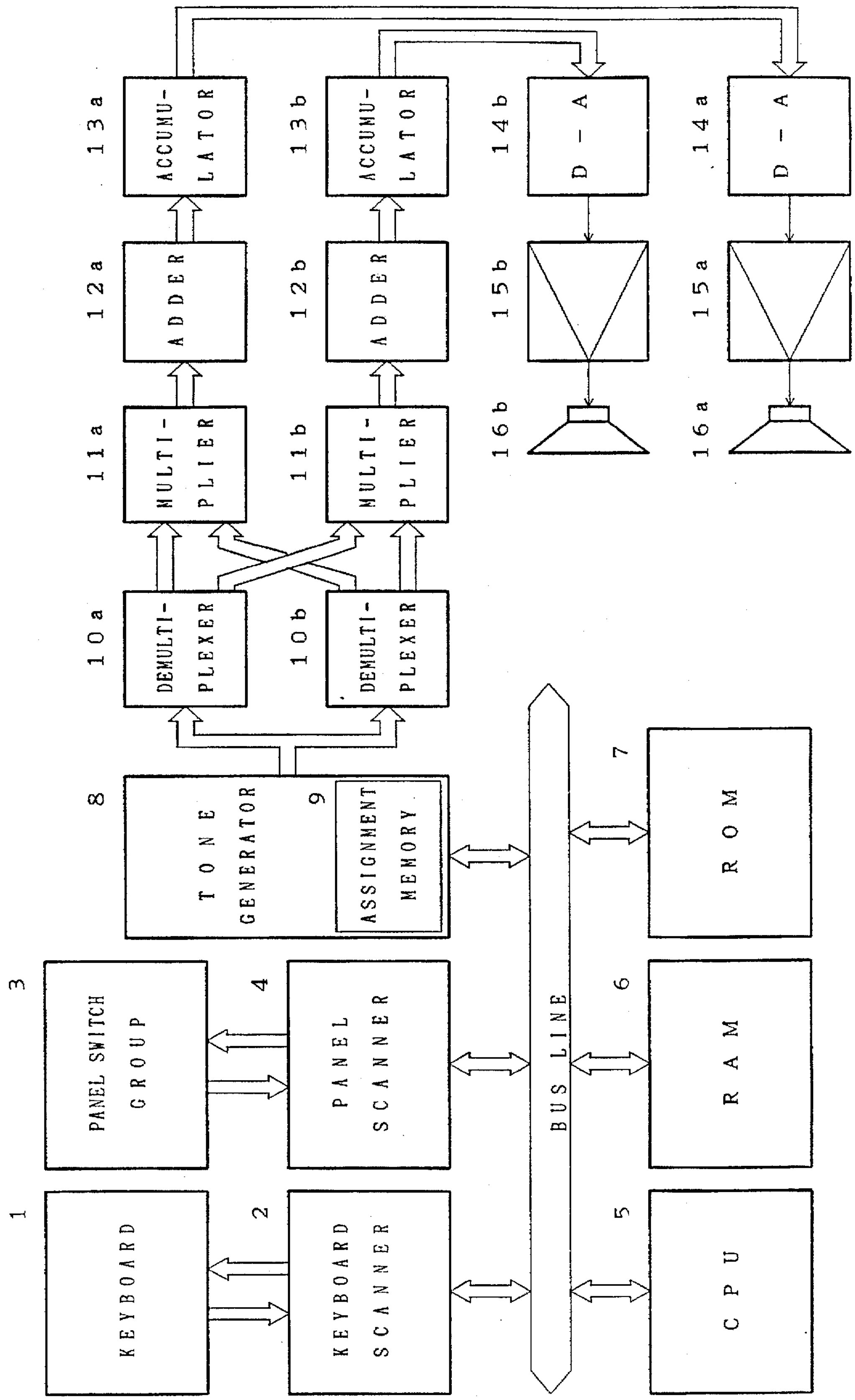
FIG. 1 is a block diagram showing the circuit of an electronic musical instrument.

FIG. 1 shows the overall circuit of an electronic musical instrument according to the invention. The individual keys on a keyboard 1 are scanned by a keyboard scanner 2 to detect key-on and key-off data. A CPU 5 writes these data in a RAM 8. The CPU 5 compares these data with corresponding key-on and key-off data having been stored in the RAM 8 to determine key-on and key-off events concerning the individual keys. The keyboard 1 may be replaced by electronic string instruments, electronic wind (or reed) instruments, electronic percussion instruments (such as pads), computer keyboards and so forth.

The individual switches 8 on a panel are scanned by a panel scanning circuit 4. By this scanning operation, switch on/off data or data concerning the extent of operation of individual switches are detected. The CPU 5 writes these data in the RAM 8 and compares these data with corresponding switch on/off data already stored in the RAM 8 to determine switch-on and switch-off events for individual switches. The RAM 6 also stores various processing data, and it further comprise working registers 21 to be described later. In a ROM 7 are stored programs to be executed by the CPU 5, corresponding to a flow chart to be described later, other processing programs and auto play data.

A tone generator 8 generates tone waveform data according to various tone information such as tone pitch or key number data, timbre or tone number data and touch (velocity) data, input from the keyboard 1 and panel switches 3. Tone waveform data may also be generated according to auto play data read out from the ROM 7 or RAM 6 and also externally input MIDI (Musical Instrument Digital Interface) data. The auto play data includes key number data noted above. The tone generator 8 generates and outputs tone waveform data according to a single key-on event.

The tone generator 8 comprises tone generation systems for a plurality of, for instance 16, channels by a time division process and thus permits polyphonic sounding of tones. Tone data TD of tones to which these channels are assigned, are stored in an assignment memory 9. It is possible to form the assignment memory 9 in the RAM 6. The above waveform data along with envelope waveform data, are stored in the ROM 7. However, it is possible to store these data in the tone generator 8.

The individual tone waveform data generated on a time division basis in the tone generator 8, are passed through two demultiplexers 10*a* and 10*b* to produce a plurality of distributed tone waveform data MW, which are passed through multipliers 11*a* and 11*b* for conversion to tone waveform data MW corresponding in level to multiplier data. The converted tone waveform data MW are combined through adders 12*a* and 12*b* and accumulators 13*a* and 13*b* and then passed through D-A converters 14*a* and 14*b*, amplifiers 15*a* and 15*b* and loudspeakers 16*a* and 16*b* for sounding, thus forming a sound image.

2. Assignment memory 9

Figure 2:
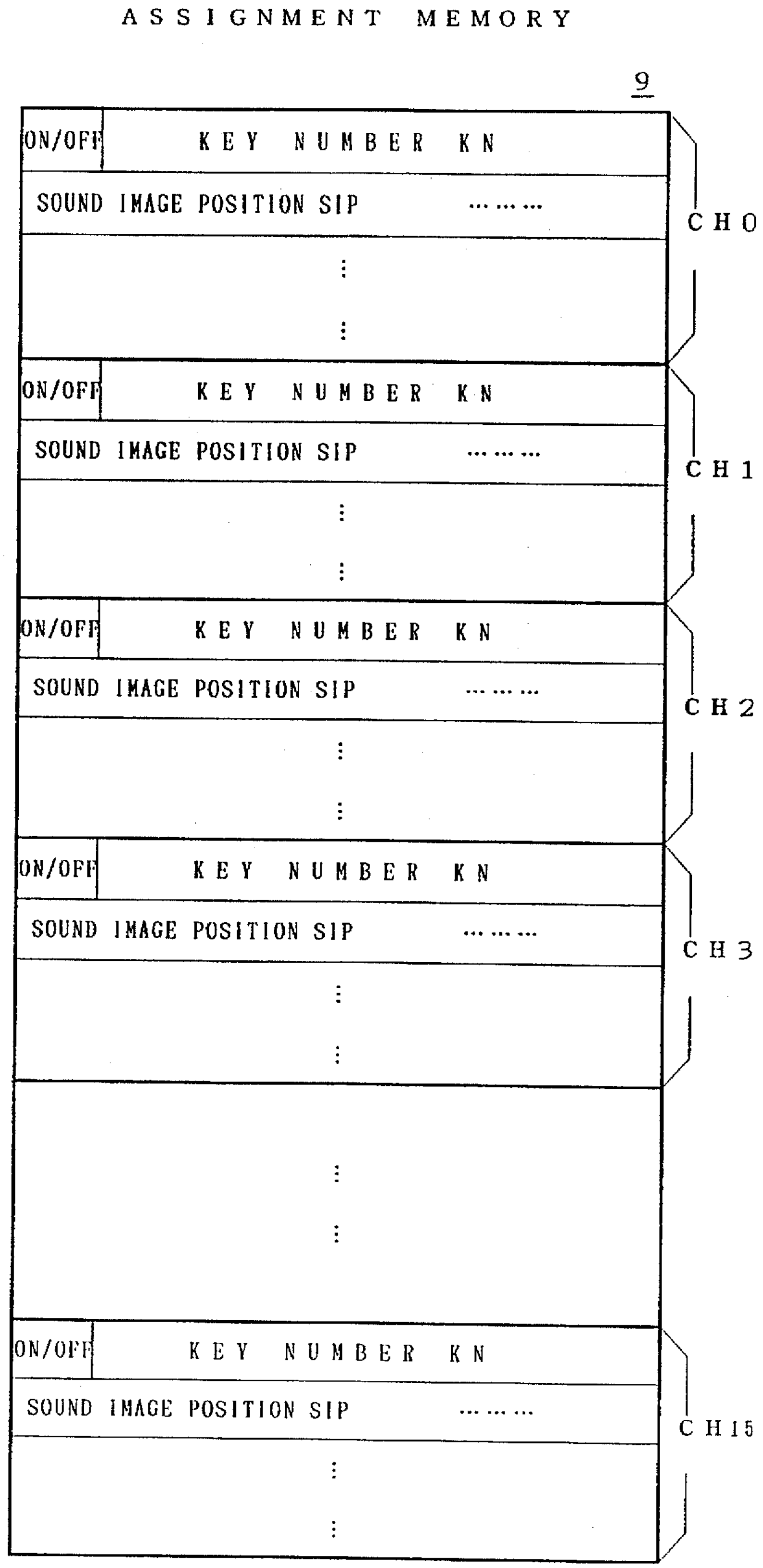
FIG. 2 is is a view showing an assignment memory 9.

FIG. 2 shows the assignment memory 9. In this assignment memory 9, memory areas for 16 channels are formed. In these memory, areas are stored tone data TD, to which the 16 tone generation channels formed in the tone generator 8 are assigned. The tone data TD stored in each channel memory area includes on/off data, key number data KN, sound image position data SIP and other data. Among the other data are tone number data indicative of the tone number, touch data indicative of the speed or strength of key-on or key-off events and tone part data indicating the part of a tone to be played.

On/off data indicates whether each key on the keyboard is "on" ("1") or "off" ("0"). Key number data KN indicates the key number of each key on the keyboard 1. Sound image position data SIP indicates the sound image position of a tone, to which the pertinent channel is assigned. Under control of the CPU 5 the sound image position data SIP is read out and supplied to the demultiplexers 10*a* and 10*b* to be described later.

The sound image position data SIP is stored in the ROM 7 or RAM 6 to be read out according to musical factors and is set in the assignment memory 9. The musical factors represent tone pitch, key number, range of notes, timbres, tone number, tone part, touch, depth of effect, depth of modulation, loudness, tempo and/or so forth. The sound image position data SIP may be calculated with the musical factors as variables, or input by a player using a ten-key keypad or the like.

3. Demultiplexers 10*a* and 10*b* and Multipliers 11*a* and 11*b*

Figure 3:
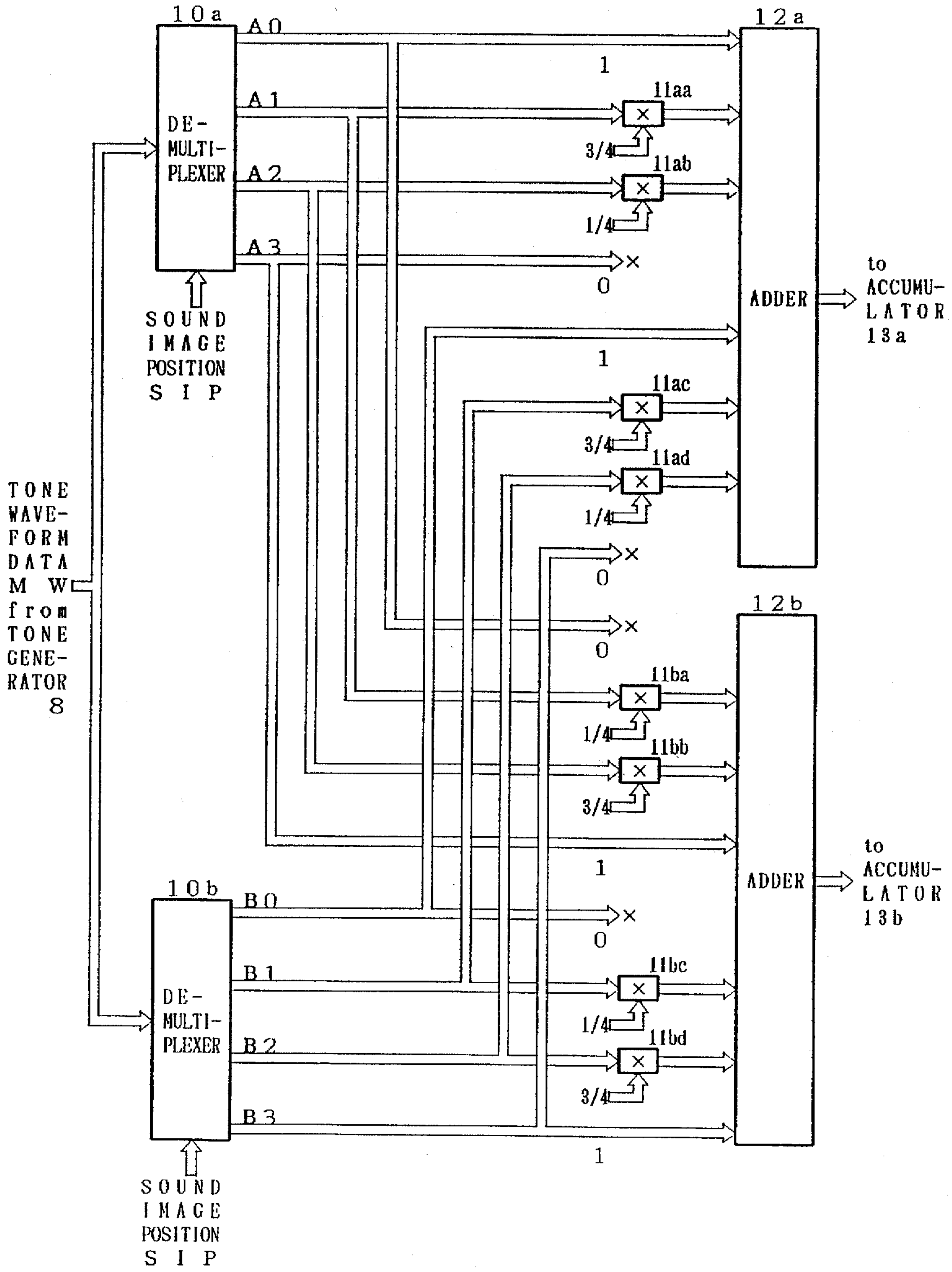
FIG. 3 is a view showing demultiplexers 10*a* and 10*b*, multipliers 11*a* and 11*b* and adders 12*a* and 12*b*.

FIG. 3 shows the demultiplexers 10*a* and 10*b* and multipliers 11*a* and 11*b*. The demultiplexer 10*a* outputs tone waveform data MW from the tone generator 8 to one of four output lines A0 to A3. Tone waveform data MW output to the output line A0 is directly input to the adder 12*a* and not input to the adder 12*b*. Tone waveform data MW output to the output line A1 is multiplied for level reduction by ¾ data in the multiplier 11*aa* before being input to the adder 12*a*. In addition, it is also multiplied for level reduction by ¼ data in the multiplier 11*ba* before being input to the adder 12*b*. Tone waveform data MW output to the output line A2 is multiplied for level reduction by ¾ data in the multiplier 11*bb* before being input to the adder 12*b*. Tone waveform data MW output to the output line A3 is input directly to the adder 12*b* and not input to the adder 12*a*.

The demultiplexer 10*b* outputs tone waveform data MW from the tone generator 8 to one of for output lines B0 to B3. The demultiplexer 10*b* and multipliers 11*ac*, 11*ad*, 11*bc* and 11*bd* are like the demultiplexer 10*a* and multipliers 11*aa*, 11*ab*, 11*ba* and 11*bd* and operate likewise to distribute tone waveform data MW by changing the level thereof.

In the above way, a single tone waveform data MW is distributed to the demultiplexers 10*a* and 10*b* and further to the multipliers 11*aa*, 11*ab*, . . . , 11*bd*, and the plurality of level-changed tone waveform data MW are added and synthesized (combined) in the adders 12*a* and 12*b*. It is thus possible to realize stereo tones with a sense of spatiality. This is because a sound image can be formed by supplying (coupling) tone waveform data MW to only one of the four output lines A0 to A3.

However, by also supplying (coupling) the tone waveform data MW to one of the other four output lines B0 to B3, the tone waveform data MW for producing stereo are multiplexed together to realize tone waveform data with a sense of spatiality. The combined multiplexed tone waveform data MW are added and synthesized (combined) in the adders 12*a* and 12*b* and accumulated in the accumulators 13*a* and 13*b* for the 16 channels. The multipliers 11*aa*, 11*ab*, . . . , 11*bd* are provided with fixed multiplication data of ¾ and ¼.

With the switching of the output lines A0 to A3 and B0 to B3 by the demultiplexers 10*a* and 10*b* as above, it is possible to set the distribution and synthesis contents of tone waveform data as desired. Further, it is possible to set the level of tone waveform data MW as desired by switching the multiplication data provided to the multipliers 11*aa*, 11*ab*, . . . , 11*bd* as desired.

To the demultiplexers 10*a* and 10*b* is fed the sound image position data SIP read out from the assignment memory 9. The sound image position data SIP determines the sound image position of tone data TD. The tone data TD is written in the assignment memory 9, and corresponds to tones, to which channels are assigned. The sound image data SIP is 4-bit data. Of this data, the upper two bits are fed to the demultiplexer 10*a*, while the lower two bits are fed to the demultiplexer 10*b*, thus effecting the selection of the output lines A0 to A3. It is possible to replace the demultiplexers 10*a* and 10*b* with AND gates having the same function and provide the sound image position data SIP as enable data to the individual AND gates.

The multiplication data fed to the multipliers 11*aa*, 11*ab*, . . . , 11*bd* are generated by combining a high level voltage from a constant voltage source in the electronic musical instrument or the like and a low level voltage from the ground for each bit. The multiplier data may have values other than the above-noted values of "1", "¾", "¼" and "0" as well. Further, the data may be input by a player by means of selection of ten-keys on a keypad or selection of the tone number or some similar operation. Each input multiplication data is set, after its converting (decoding) if necessary, in a plurality of latches, for instance, before being fed to the multipliers 11*aa*, 11*ab*, . . . , 11*bd*.

4. Sound Image Position

FIG. 4 shows sound image positions. These sound image positions are formed through distribution and combination of tone waveform data MW in the demultiplexers 10*a* and 10*b*, and multipliers 11*aa*, 11*ab*, . . . , 11*bd*. The illustrated case has a total of nine sound image positions (DIRECTIONS), i.e., the right end position R of "0", the left end position L of "1" and intermediate positions uniformly dividing the interval between the right and left end positions, respectively of "1/8", 2/8"3/8", "4/8", "5/8", "6/8" and "7/8".

The sound image positions formed with the sole tone waveform data MW of the eight output lines A0, A1, . . . , B3 of the demultiplexers 10*a* and 10*b* are "0" with the output lines A0 and B0, "2/8", i.e., "¼", with the output lines A1 and B1, "6/8", i.e., "¾", with the output lines A2 and B2, and "1" with the output lines A3 and B3.

With sound image position data SIP of "0000", the output lines AO and BO are selected, and the sound image position R of "0" is synthesized from the data "0" on the two lines A0 and B0. With sound image data SIP of "0001", the output lines A0 and B1 are selected, and the sound image position of "⅛" is synthesized from the data "0" and "2/8" on the respective output lines A0 and B1.

With sound image position data SIP of "0010", the output lines A0 and B2 are selected, and the sound image position of "3/8" is synthesized from the data "0" and "6/8" on the respective output lines A0 and B2. . . With sound image position data SIP of "0110", the output lines A1 and B2 are selected, and the sound image position of "4/8" is synthesized from the data "2/8" and "6/8" on the respective output lines A1 and B2.

In the long run, the sound image position that is formed is a position mid way between the sound image positions of the two output lines which are selected from the eight output lines A0, A1, . . . , B3 by the demultiplexers 10*a* and 10*b*.

5. Second Embodiment

Figure 5:
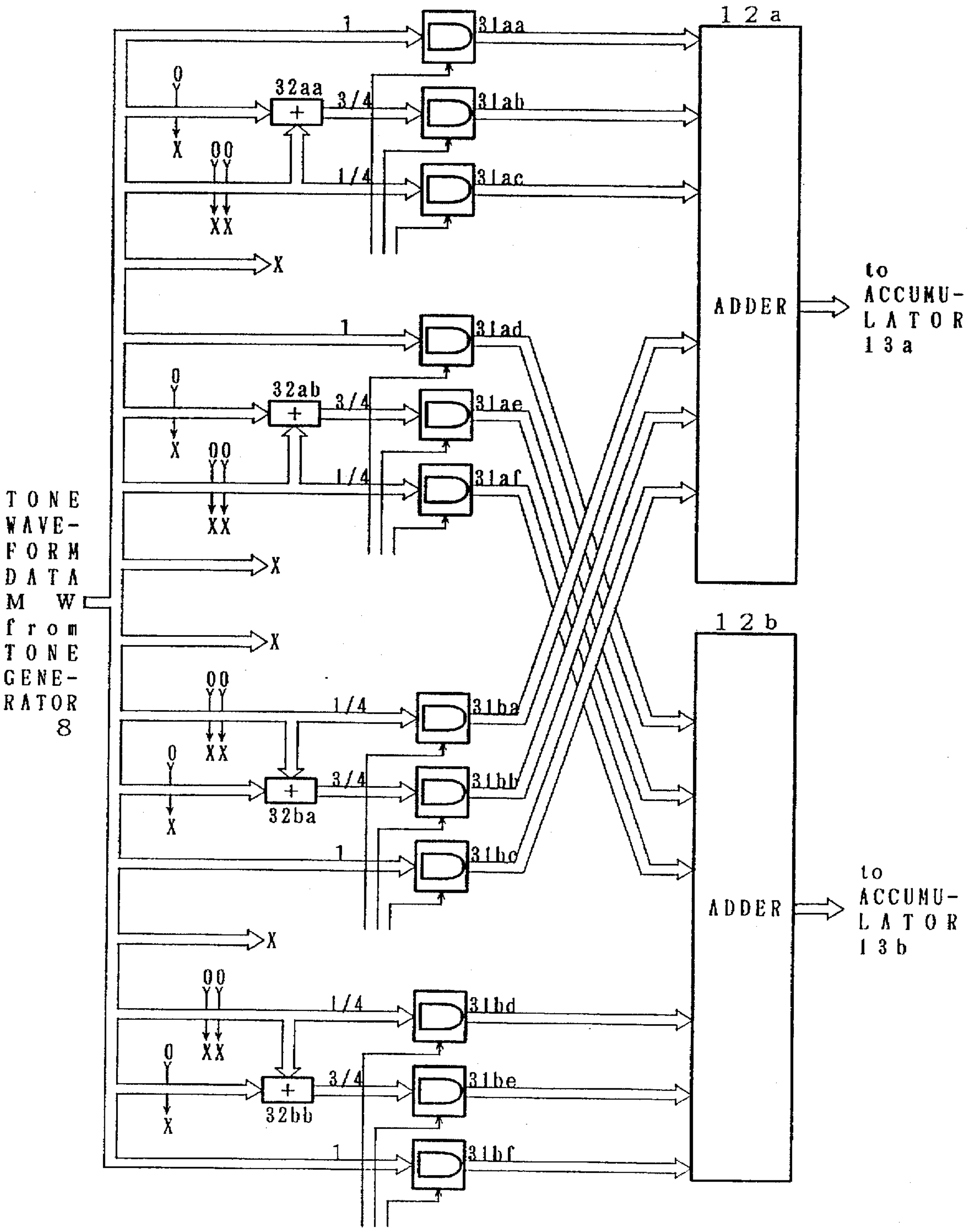
FIG. 5 is a view showing a second embodiment of the invention.

FIG. 5 shows a second embodiment of the invention. In this embodiment, the channel memory areas of the assignment memory 9 are assigned to the tone waveform data MW according to the sound image position formed by the sound image position data SIP. For example, if the sound position data SIP is "0000", channel "0" is assigned. If the data SIP is "0001", channel "1" is assigned. If the data SIP is "0010", channel "2" is assigned. Likewise, if the data SIP is "1111". channel "15" is assigned.

The tone waveform data MW generated for each division time of the channel, is output from the tone generator 8 to the following 12 routes. In a first route, the tone waveform data MW is fed through an AND gate 31*aa* to adder 12*a*. In a second route, the tone waveform data MW is shifted down respectively by one bit and two bits to obtain ½ and ¼ data, which are added together in an adder 32*aa* to obtain ¾ data which is fed through an AND gate 31*ab* to the adder 12*a*. In a third route, the tone waveform data MW is shifted down by two bits to obtain ¼ data which is fed through an AND gate 31*ac* to the adder 12*a*.

In a fourth route, the tone waveform data MW is fed through an AND gate 31*ad* to the adder 12*b*. In a fifth route, the tone waveform data MW is shifted down respectively by one bit and two bits to obtain ½ and ¼ data, which are added together in an adder 32*ab* to obtain ¾ data which is fed through an AND gate 31*ae* to the adder 12*b*. In a sixth route the tone waveform data MW is shifted down by two bits to obtain ¼ data, which is fed through an AND gate 31*af* to the adder 12*b*.

In a seventh route, the tone waveform data MW is shifted down by two bits to obtain ¼ data, which is fed through an AND gate 31*ba* to the adder 12*a*. In an eighth route, the tone waveform data MW is shifted down respectively by one bit and two bits to obtain ½ and ¼ data, which are added together in an adder 32*ba* to obtain ¾ data which is fed through an adder 31*bb* to the adder 12*a*. In a ninth route, the tone waveform data MW is fed through an AND gate 31*bc* to the adder 12*a*.

In a tenth route, the tone waveform data is shifted down by two bits to obtain ¼ data, which is fed through an AND gate 31*bd* to the adder 12*b*. In an eleventh route, the tone waveform data MW is shifted down respectively by one bit and two bits to obtain ½ and ¼ data, which are added together in an adder 32*bb* to obtain ¾ data which is fed through an AND gate 31*be* to the adder 12*b*. In a twelfth route, the tone waveform signal MW is fed through an AND gate 31*bf* to the adder 12*b*.

In the above 12 AND gates 31*aa*, 31*ab*, . . . , 31*af*, 31*ba*, 31*bb*, . . . , 31*bf*, the respective bits of the tone waveform data MW are output through a plurality of AND gates. Data obtained by converting (decoding) of channel number data to be described later is fed as an enable signal to the plurality of AND gates.

The 12 AND gates 31*aa*, 31*ab*, . . . , 31*af*, 31*ba*, 31*bb*, . . . , 31*bf* are on-off (enabling/disenabling) controlled according to the value of channel number data, which is the count of a channel counter (not shown). The channel number data fed to the AND gates 31*aa*, 31*ab*, . . . , 31*bf* as enable data is converted (decoded) as follows.

If the channel number data is "0000", the AND gates 31*aa* and 31*ad* are enabled. If the channel number data is "0001", the AND gates 31*aa*, 31*ae* and 31*bd* are enabled. If the channel number data is "0010", the AND gates 31*aa*, 31*af* and 31*be* are enabled. If the channel number data is "0011", the AND gates 31*aa* and 31*bf* are enabled.

If the channel number data is "0100", the AND gates 31*ab*, 31*ba* and 31*ad* are enabled. If the channel number data is "0101", the AND gates 31*ab*, 31*ba*, 31*ae* and 31*bd* are enabled. If the channel number data "0110", the AND gates 31*ab*, 31*ba*, 31*af* and 31*be* are enabled. If the channel number data is "0111", the AND gates 31*ab*, 31*ba* and 31*bf* are enabled.

If the channel number data is "1000", the AND gates 31*ac*, 31*bb* and 31*ad* are enabled. If the channel number data is "1001", the AND gates 31*ac*, 31*bb*, 31*ae* and 31*bd* are enabled. If the channel number data is "1010", the AND gates 31*ac*, 31*bb*, 31*af* and 31*be* are enabled. If the channel number data is "1011", the AND gates 31*ac*, 31*bb* and 31*bf* are enabled.

If the channel number data is "1100", the AND gates 31*bc* and 31*ad* are enabled. If the channel number data is "1101", the AND gates 31*bc*, 31*ae* and 31*bd* are enabled. If the channel number data is "1110", the AND gates 31*bc*, 31*af* and 31*be* are enabled. If the channel number data is "1111", the AND gates 31*bc* and 31*bf* are enabled.

It is possible to set the number of channels formed in the tone generator 8 and the number of channel memory areas in the assignment memory 9 to be more than 16, for instance 32, 64, . . . In such a case, the number of channels corresponding to one of the 16 routes is 2, 4 . . . Channel delivery is effected for respective channels for a route i.e., a sound image position in a predetermined order, such as from the channel assigned to the lowest envelope level data. Accumulators 13*a* and 13*b* respectively accumulate tone waveform data MW for 32, 64 or so forth channels. In this embodiment, there is no need to store the sound image position data SIP in the assignment memory 9.

As a modification, it is possible to make the individual channel memory areas of the assignment memory 9 correspond to the eight output lines A0, A1, . . . , B3 in the first embodiment and determine the channels for assignment according to the output lines. For example, it may be arranged such that the tone waveform data MW, to which channels "0" and "1" are assigned, are output to the output line A0, that the data MW, to which channels "2" and "3" are assigned, are output to the output line A1 and so forth and that likewise the data MW, to which channels "14" and "15" are assigned, are output to the output line B3.

In this case, the same tone data TD is written in two channel memory areas of the assignment memory 9, and the same tone waveform data MW is generated from the two channels. The two channels correspond to the output line corresponding to the sound image position data SIP. For example, with sound image position data SIP of "0010", channel "0" or "1" corresponding to the output line A0 and channel "12" or "18" corresponding to the output line B2 are assigned to the tone data TD. The selection of the channels "0" and "1" and the selection of the channels "12" and "13" are made according to a predetermined order, such as from the channel for the lowest envelope level data.

Thus, it is possible to supply the tone waveform data MW to either one of the demultiplexers 10*a* and 10*b* depending on one of the 16 channels. In addition, it is possible to dispense with the adders 12*a* and 12*b* and supply the demultiplexer output to either accumulator 13*a* or 13*b*. In this case, the outputs of the AND gates 31*aa*, 31*ab*, . . . , 31*af* are fed through an OR gate to the accumulator 13*a*, and the outputs of the AND gates 31*ba*, 31*bb*, . . . , 31*bf* are fed through an OR gate to the accumulator 13*b*.

Further, it is possible to replace the multipliers 11*aa*, 11*ab*, . . . , 11*bd* in the first embodiment with shifters for shifting the tone waveform data MW in the second embodiment. Further, it is possible to replace the demultiplexers 10*a* and 10*b* in the first embodiment with the AND gates 31*aa*, 31*ab*, . . . , 31*bf* in the second embodiment.

6. Third Embodiment

Figure 6:
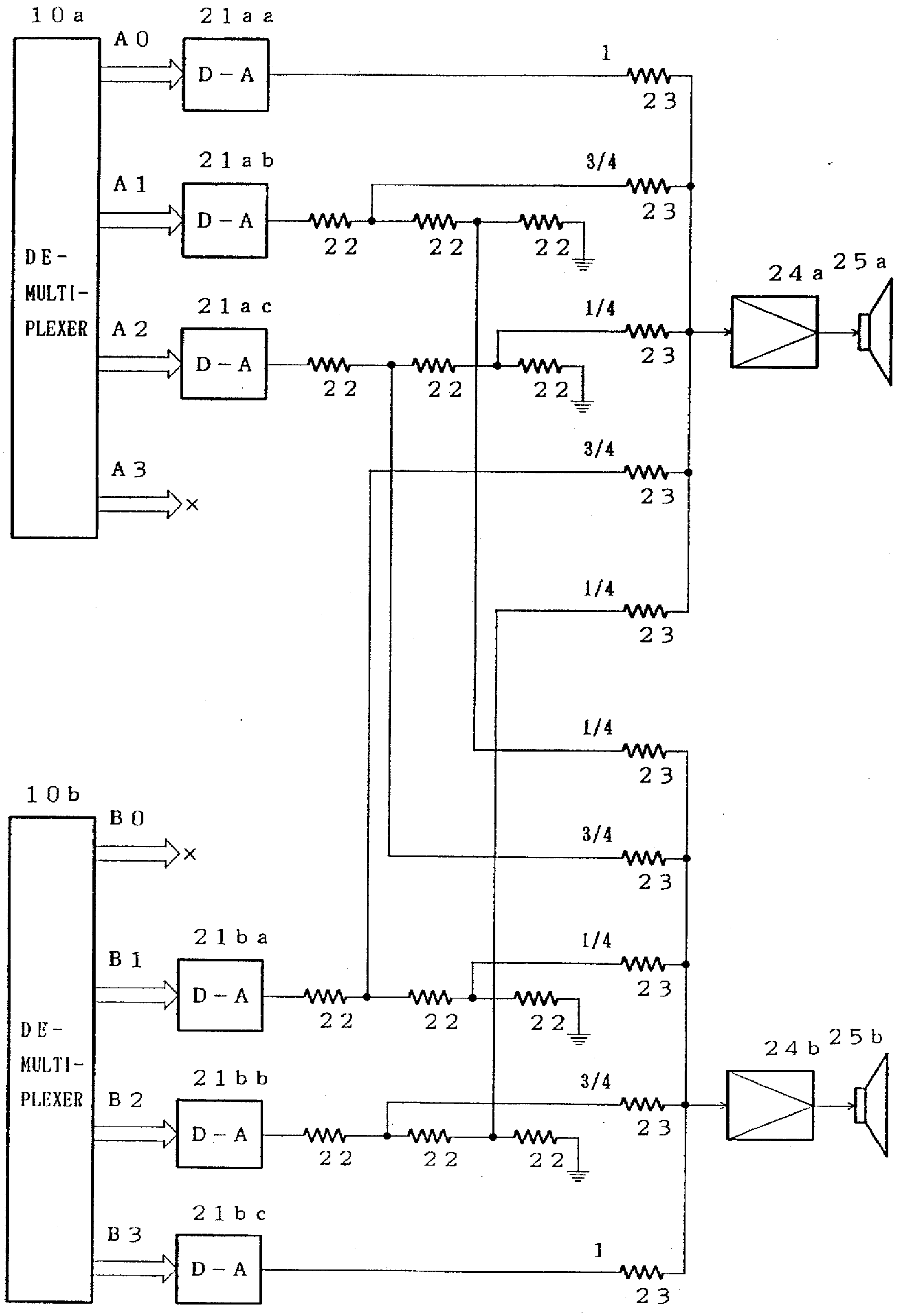
FIG. 6 is a view showing a third embodiment of the invention.

FIG. 6 shows a third embodiment. In this embodiment, analog data is converted to stereo data. Tone waveform data MW is distributedly output to the output lines A0, A1, . . . , B3 selected by the demultiplexers 10*a* and 10B, and converted to analog signals by D-A converter 21*aa*, 21*ab*, . . . , 21*bc*.

The analog tone waveform data MW thus obtained is shifted down by voltage division resistors 22 to levels "1", "¾", "¼" and "0", which are then synthesized (combined) through mixing resistors 23. The resultant data is synthesized (coupled) through an amplifier 24*a* or 24*b* to be sounded through a loudspeaker 25*a* or 25*b*. In this way, a sound image is formed. Of the levels, to which the analog tone waveform data MW is shifted down, the level "1" is such that the data MW is fed directly, i.e., without the use of any voltage division resistor 22, to the associated mixing resistor 23, while the level "0" is such that no data MW is fed.

While some preferred embodiments of the invention have been described above, they are by no means limitative and can be modified in various ways without departing from the scope and spirit of the invention. For example, the values of the multiplication data shown in FIG. 3, the extent of shifting down the tone waveform data MW shown in FIG. 5 and the voltage division factors of the voltage division resistors 22 in FIG. 6, are not limited to those noted above but may be set to any desired values, for instance to "⅛", "2/8", "⅜", "4/8", "⅝", "6/8", "⅞" and "1". In this case, the multiplication data is 3-bit data though it is 2-bit data in the above embodiments. It is possible to set the bit number of this data as desired.

Further, it is possible to provide a sound image position slide switch and permit the sound image position to be changed by operating this switch. In this case, data corresponding to the extent that the sound image position slide switch is moved is added to or used to multiply the sound image position data SIP. It is possible to apply the use of this type of sound image position slide switch to each tone pitch, each key number, each range of notes, each timbre, each touch, each tone part, each effect, each modulation, each loudness and/or so forth.

The change in the sound image may be, in addition to a change in or selection of the sound image position, a change in the number of sound images or a change in the sound image slide pattern. For the sound image number change, the sound position data SIP stored in the RAM 6 or ROM 7 are provided as a plurality of data for one musical factor, and a plurality of channels are assigned at one time to the same tone data TD. For the sound image slide pattern change, the value of the sound image position data SIP fed to the demultiplexers 10*a* and 10*b* is changed periodically by adding, subtracting, multiplying or dividing periodically changing data to, from or by the data SIP.

Further, it is possible to construct a three- or more channel stereo system having three or more loudspeakers by providing, in addition to the left and right loudspeakers 16*a* and 16*b*, upper and lower, front and rear and other loudspeakers. In this case, three or more tone generators 8, demultiplexers 10*a* and 10*b*, multipliers 11*a* and 11*b*, adders 12*a* and 12*b*, accumulators 13*a* and 13*b*, D-A converters 14*a* and 14*b* and amplifiers 15*a* and 15*b*, and sound image position data SIP of 6- or more bit data corresponding to three or more demultiplexers 10 are required.

Further, the sound (acoustic) signal output from the loudspeakers 16*a* and 16*b* may be tones generated by analog data processing or sound sources of tape recorders, optical digital disc reproducers, floppy disc reproducers, television receiver tuners and so forth as well as tones generated by digital data processing. Further, it is possible to provide reverberation to the tone waveform data MW by adding a digital delay circuit and/or an analog delay circuit to the circuits shown in FIGS. 3 and 5.

What is claimed is:

1. An electronic stereo acoustic system comprising:

sound data generator means for generating sound data;

sound image position data generation means for generating sound image position data indicative of a sound image position of the sound data;

distributing means for selectively distributing a sound data generated from said sound data generator means simultaneously to at least two of a plurality of sound data outputs in accordance with the sound image position data, each of the at least two sound data outputs being distributed along both first and second channels;

a plurality of level changing means, coupled to said distributing means, for respectively changing levels of the plurality of sound data outputs to respective different levels to set a sound image position of the sound data; and a plurality of sound means for effecting sounding according to outputs of said plurality of level changing means, thereby forming a sound image, the plurality of changing levels changed respectively by said plurality of level changing means are fixed and different from each other, at least two of the plurality of changing levels being selected by said distributing means, the sound image being formed by the selection of the fixed and different changing levels.

2. The electronic stereo acoustic system according to claim 1, wherein said sound data generator means generates a plurality of sound data and the electronic stereo acoustic system processes said plurality of sound data on a time division basis.

3. The electronic stereo acoustic system according to claim 2 further comprising synthesizing means for producing a plurality of sound data by synthesizing said outputs of said plurality of level changing means and for providing said plurality of sound data to said plurality of sound means to effect sounding, said synthesizing means setting synthesis content of said plurality of sound data outputs.

4. The electronic stereo acoustic system according to claim 1 or 2, wherein said plurality of sound means forms a sound image having a plurality of sound image positions for a corresponding number of channels formed through a time division processing.

5. The electronic stereo acoustic system of claim 1, wherein said plurality of level changing means each include a plurality of bit shifters for shifting down bits of the plurality of sound data outputs and a plurality of adders for adding the shifted sound data outputs.

6. A method of generating stereo sound using an electronic acoustic system comprising the steps of:

(A) generating sound data;

(B) generating sound image position data indicative of a sound image position of the sound data;

(C) selectively distributing a sound data generated in said step (A) simultaneously to at least two of a plurality of sound data outputs in accordance with the sound image position data, each of the at least two sound data outputs being distributed along both first and second channels;

(D) changing respective levels of the plurality of sound data outputs to respective different levels to set a sound image position of the sound data; and (E) sounding the plurality of level changed sound data outputs of said step (D) to form a sound image, the plurality of changing levels changed in said step (D) are fixed and different from each other, at least two of the plurality of changing levels being selected in said step (C), the sound image being formed by the selection of the fixed and different changing levels.

7. The method of generating stereo sound using an electronic acoustic system according to claim 6, wherein said step (D) further comprises synthesizing the plurality of level changed sound data outputs to form a plurality of synthesized sound data, the plurality of synthesized sound data being sounded in step (E), wherein contents of said plurality of synthesized sound data can be set.

8. An electronic stereo acoustic system comprising:

sound data generating means for generating sound data;

sound image position data generating means for generating sound image position data indicative of a sound image position of the sound data;

distributing means for selectively outputting a sound data received from said sound data generating means to one of sound data outputs in accordance with the sound image position data to set a sound image position of the sound data, each of the sound data outputs being distributed along both first and second stereo channels;

a plurality of level changing means, coupled to said distributing means, for respectively changing levels of the sound data outputs;

synthesizing means for adding and accumulating outputs of said plurality of level changing means to generate synthesized sound data; and sounding means for generating stereo sound in accordance with the synthesized sound data to form a sound image, said distributing means comprising plural distributing means each selectively outputting the sound data received from said sound data generating means simultaneously to one of sound data outputs of respective plural sets of sound data outputs, the plurality of changing levels changed respectively by said plurality of level changing means are fixed and different from each other, at least two of the plurality of changing levels being selected by said distributing means, the sound image being formed by the selection of the fixed and different changing levels.

9. The electronic stereo acoustic system of claim 8, wherein said synthesizing means respective adds and accumulates the plural sets of sound data outputs wherein said sounding means generates plural channel stereo sound.

10. The electronic stereo acoustic system of claim 8, wherein said plurality of level changing means comprise multipliers for multiplying a respective one of the sound data outputs by respective different values.

11. The electronic stereo acoustic system of claim 8, wherein said sound image position data generating means comprises memory means for storing and supplying the sound image position data to said distributing means for designating one of the sound data outputs for the sound data generated by said sound data generating means.

12. The electronic stereo acoustic system of claim 8, wherein said plurality of level changing means comprise first resistors configured as voltage dividers for attenuating the sound data outputs.

13. The electronic stereo acoustic system of claim 12, wherein said synthesizing means comprises a plurality of mixing resistors through which the outputs of said plurality of level changing means are added.

14. An electronic stereo acoustic system comprising:

sound image position data generating means for generating sound image position data;

sound data generator means for generating a plurality of sound data;

distributing means for distributing a sound data of the plurality of sound data received from said sound data generator means to a plurality of sound data outputs and selecting at least two of the distributed plurality of sound data outputs in accordance with the sound image position data received from said sound image position data generating means, each of the sound data outputs being distributed along both first and second stereo channels;

a plurality of level changing means, coupled to said distributing means, for respectively changing levels of the plurality of sound data outputs such that the selected distributed plurality of sound data outputs set a sound image position of the sound data;

synthesizing means for synthesizing outputs of said plurality of level changing means to generate synthesized sound data; and sounding means for generating stereo sound in accordance with the synthesized sound data to form at least one sound image, the plurality of changing levels changed respectively by said plurality of level changing means are fixed and different from each other, at least two of the plurality of changing levels being selected by said distributing means, the sound image being formed by the selection of the fixed and different changing levels.

15. The electronic stereo acoustic system according to claim 2 or 14, wherein said plurality of level changing means set the levels of each of said plurality of sound data outputs as desired.

16. The electronic stereo acoustic system according to claim 2 or 14, said distributing means sets distribution content of said plurality of sound data outputs as desired.

17. The electric stereo acoustic system of claim 14, wherein said sound image position data generating means generates at least two sound image position data, said distributing means distributes and selects the sound data to at least four sound data outputs, said plurality of level changing means respectively change levels of the at least four sound data outputs, and said synthesizing means synthesizes two of the at least four level changed sound data outputs and also synthesizes the other two of the at least four level changed sound data outputs, respectively.

18. The electronic stereo acoustic system of claim 14 or 17, wherein said sound image position data generating means generates the sound image position data according to a musical factor.

19. The electronic stereo acoustic system of claim 18, wherein the musical factor is one of a tone pitch, key number, range of notes, timbres, tone number, tone part, touch, depth of effect, depth of modulation, loudness and tempo.

20. The electronic stereo acoustic system according to claim 14, wherein said sound data generator means generates a plurality of sound data and the electronic stereo acoustic system processes said plurality of sound data on a time division basis.

21. The electronic stereo acoustic system according to claim 14, wherein said synthesizing means sets synthesis content of said plurality of sound data outputs.

22. A method of generating stereo sound using an electronic acoustic system comprising the steps of:

(A) generating at least one sound data;

(B) generating sound image position data;

(C) distributing the sound data generated in said step (A) to a plurality of sound data outputs and selecting at least two of the distributed plurality of sound data outputs in accordance with the sound image position data generated in said step (B), each of the sound data outputs being distributed along both first and second stereo channels;

(D) changing respective levels of the plurality of sound data outputs such that the selected distributed plurality of sound data outputs set a sound image position of the sound data;

(E) synthesizing the level changed plurality of sound data outputs of said step (D) to generate synthesized sound data; and (F) generating stereo sound in accordance with the synthesized sound data to form at least one sound image, the plurality of changing levels changed in said step (D) are fixed and different from each other, at least two of the plurality of changing levels being selected in said step (C), the sound image being formed by the selection of the fixed and different changing levels.

23. The method of generating stereo sound using an electronic acoustic system according to claim 6 or 22, wherein a plurality of sound data are produced in said step (A), said plurality of the sound data being processed on a time division basis.

24. The method of generating stereo sound using an electronic acoustic system according to claim 23, wherein in said step (C) distribution content of said plurality of sound data outputs can be set as desired.

25. The method of generating stereo sound using an electronic acoustic system according to claim 6 or 22, wherein in said step (D) the levels of the plurality of sound data outputs can be set as desired.

26. The method of generating stereo sound using an electronic acoustic system according to claim 6 or 22, wherein in said step (E) a plurality of sound image positions for a corresponding number of channels formed through a time division processing are formed to form a sound image.

27. The method of generating stereo sound using an electronic acoustic system of claim 22, wherein said step (B) comprises generating at least two sound image position data, said step (C) comprises distributing and selecting the sound data to at least four sound data outputs, said step (D) comprises respectively changing the level of the at least four sound data outputs, and said step (E) comprises synthesizing two of the at least four level changed sound data outputs of said step (D) and synthesizing the other two of the at least four level changed sound data outputs, respectively.

28. The method of generating stereo sound using an electronic acoustic system of claims 22 or 27, wherein said step (B) comprises generating the sound image position data in accordance with a musical factor.

29. The method of generating stereo sound using an electronic acoustic system of claim 28, wherein the musical factor is one of tone pitch, key number, range of notes, timbres, tone number, tone part, touch, depth of effect, depth of modulation, loudness and tempo.

30. The method of generating stereo sound using an electronic acoustic system according to claim 22, wherein in said step (C) distribution content of said plurality of sound data outputs can be set as desired.

31. The method of generating stereo sound using an electronic acoustic system according to claim 22, wherein in said step (E) contents of said plurality of synthesized sound data can be set.

32. An electronic stereo acoustic system comprising:

sound data generator means for generating sound data;

sound image position data generation means for generating sound image position data indicative of a sound image position of the sound data;

a plurality of level changing means, coupled to said sound data generator means, for each respectively changing a level of the sound data to output a plurality of level changed sound data outputs;

distribution means, coupled to said plurality of level changing means, for selectively providing as distributed outputs at least two of said level changed sound data outputs in accordance with the sound image position data; and a plurality of sound means for effecting sounding according to outputs of said distribution means, thereby forming a sound image, the plurality of changing levels changed respectively by said plurality of level changing means are fixed and different from each other, at least two of the plurality of changing levels being selected by said distribution means, the sound image being formed by the selection of the fixed and different changing levels.

33. A method of generating stereo sound using an electronic acoustic system comprising the steps of:

(A) generating sound data;

(B) generating sound image position data indicative of a sound image of the sound data;

(C) changing a level of the sound data to respectively provide a plurality of level changed sound data outputs having different levels;

(D) selectively distributing at least two of the plurality of level changed sound data outputs as distributed sound data outputs in accordance with the sound image position data; and (E) effecting sounding of the distributed sound data outputs to provide a plurality of synthesized sound data outputs to form a sound image, the plurality of changing levels changed respectively in said step (C) are fixed and different from each other, at least two of the plurality of changing levels being selected in said step (D), the sound image being formed by the selection of the fixed and different changing levels.

* * * * *